US012693338B2

(12) United States Patent
Ito et al.

(10) Patent No.: US 12,693,338 B2
(45) Date of Patent: Jul. 28, 2026

(54) MANAGEMENT DEVICE, ENERGY STORAGE SYSTEM, AND METHOD FOR CONSTRUCTING ENERGY STORAGE SYSTEM

(71) Applicant: GS Yuasa International Ltd., Kyoto (JP)

(72) Inventors: Hirokazu Ito, Kyoto (JP); Syuichi Takemoto, Kyoto (JP); Kenta Yoshimoto, Kyoto (JP); Masayuki Iwasaki, Kyoto (JP); Kazuo Haruki, Kyoto (JP); Tatsuya Inoue, Kyoto (JP); Tsutomu Ueno, Kyoto (JP); Takafumi Akagi, Kyoto (JP); Yuya Yamashita, Kyoto (JP)

(73) Assignee: GS Yuasa International Ltd., Kyoto (JP)

( * ) Notice: Subject to any disclaimer, the term of this patent is extended or adjusted under 35 U.S.C. 154(b) by 123 days.

(21) Appl. No.: 18/694,923

(22) PCT Filed: Aug. 25, 2022

(86) PCT No.: PCT/JP2022/032030
§ 371 (c)(1),
(2) Date: Mar. 22, 2024

(87) PCT Pub. No.: WO2023/047880
PCT Pub. Date: Mar. 30, 2023

(65) Prior Publication Data
US 2024/0402255 A1 Dec. 5, 2024

(30) Foreign Application Priority Data
Sep. 24, 2021 (JP) ................................. 2021-155657

(51) Int. Cl.
| | |
|---|---|
| *G01R 31/371* | (2019.01) |
| *G01R 31/396* | (2019.01) |
| *H02J 7/82* | (2026.01) |

(52) U.S. Cl.
CPC ......... *G01R 31/371* (2019.01); *G01R 31/396* (2019.01); *H02J 7/82* (2026.01)

(58) Field of Classification Search
CPC .... G01R 31/371; G01R 31/396; H02J 7/0048
(Continued)

(56) References Cited

U.S. PATENT DOCUMENTS

| | | | |
|---|---|---|---|
| 8,756,381 B2 * | 6/2014 | Muramatsu | ........... G06F 11/201 |
| | | | 711/E12.001 |
| 2007/0101027 A1 * | 5/2007 | Li | ......................... G06F 3/0632 |
| | | | 710/32 |

(Continued)

FOREIGN PATENT DOCUMENTS

| | | |
|---|---|---|
| JP | H 06-195582 A | 7/1994 |
| JP | 2003-174726 A | 6/2003 |

(Continued)

OTHER PUBLICATIONS

International Search Report and Written Opinion for Patent Cooperation Treaty Application No. PCT/JP2022/032030, dated Oct. 4, 2022, 8 pages.

*Primary Examiner* — Giovanni Astacio-Oquendo
*Assistant Examiner* — Trung Q Nguyen
(74) *Attorney, Agent, or Firm* — Buchalter LLP

(57) ABSTRACT

A management device includes: a first communication unit that receives state data of an energy storage device; a second communication unit that receives identification data transmitted from a host device; an external terminal to which a switch is connected and which receives an input from the switch; a state detection unit that detects a state of the switch (Continued)

via the external terminal; and a processing unit that stores the identification data in a storage unit when the second communication unit receives the identification data and the state detection unit detects that the switch is in a specific state, in which the state data received by the first communication unit is transmitted to the host device or another device in association with the identification data stored in the storage unit.

10 Claims, 9 Drawing Sheets

(58) Field of Classification Search
USPC ...................... 324/500, 600, 76.11, 415–435
See application file for complete search history.

(56) References Cited

U.S. PATENT DOCUMENTS

| | | | |
|---|---|---|---|
| 2013/0249475 A1 | 9/2013 | Kang et al. | |
| 2015/0318724 A1* | 11/2015 | Brockman | ........... G01R 31/371 |
| | | | 320/152 |
| 2016/0116545 A1* | 4/2016 | Fukuhara | ............. G01R 31/396 |
| | | | 324/434 |
| 2017/0222275 A1* | 8/2017 | Krishnan | ............ H01M 10/425 |
| 2020/0127470 A1* | 4/2020 | Botts | ................... H01M 10/425 |
| 2020/0168960 A1* | 5/2020 | Murase | ................. B60L 3/0046 |
| 2020/0403415 A1 | 12/2020 | Inoue et al. | |
| 2021/0367277 A1* | 11/2021 | Takechi | ............. H01M 10/482 |
| 2022/0229115 A1 | 7/2022 | Yamamoto et al. | |

FOREIGN PATENT DOCUMENTS

| | | |
|---|---|---|
| JP | 2008-294834 A | 12/2008 |
| JP | 2013-070441 A | 4/2013 |
| JP | 2014-522629 A | 9/2014 |
| JP | 2019-511077 A | 4/2019 |
| JP | 2019-158666 A | 9/2019 |
| JP | 2019-215964 A | 12/2019 |
| JP | 6822624 B1 | 5/2021 |

* cited by examiner

Fig. 7

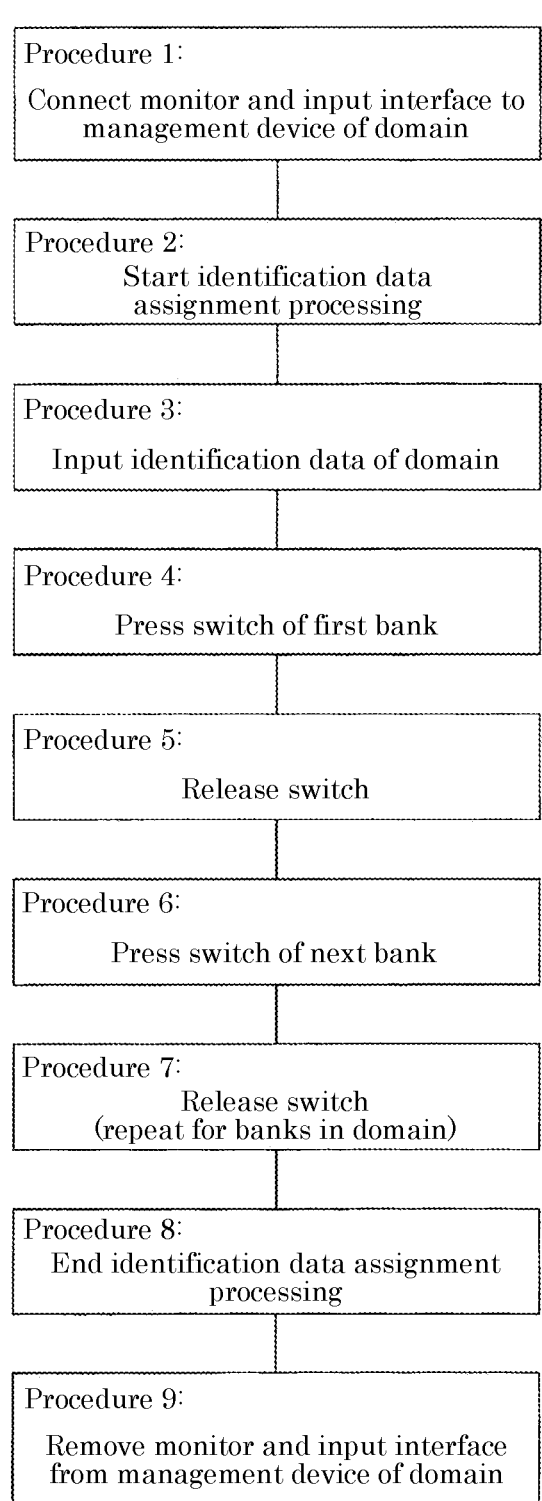

Procedure 1:
Connect monitor and input interface to management device of domain

Procedure 2:
Start identification data assignment processing

Procedure 3:
Input identification data of domain

Procedure 4:
Press switch of first bank

Procedure 5:
Release switch

Procedure 6:
Press switch of next bank

Procedure 7:
Release switch
(repeat for banks in domain)

Procedure 8:
End identification data assignment processing

Procedure 9:
Remove monitor and input interface from management device of domain

MANAGEMENT DEVICE, ENERGY STORAGE SYSTEM, AND METHOD FOR CONSTRUCTING ENERGY STORAGE SYSTEM

CROSS REFERENCE TO RELATED APPLICATIONS

This application is a National Stage Application, filed under 35 U.S.C. § 371, of International Application No. PCT/JP2022/032030, filed Aug. 25, 2022, which international application claims priority to and the benefit of Japanese Application No. 2021-155657, filed Sep. 24, 2021; the contents of both of which are hereby incorporated by reference in their entirety.

BACKGROUND

Technical Field

The present invention relates to an energy storage device management device, an energy storage system, and a method for constructing the energy storage system.

Description of Related Art

In order to temporarily store electric power generated using renewable energy or electric power generated by an existing power generating system, use of an energy storage device is expanding.

An energy storage device such as a lead-acid battery or a lithium ion battery is provided in parallel with, for example, a solar power generating system or a wind power generating system. In a large-scale power generating system, a very large number of energy storage devices are installed and used.

Even in the case of realizing power peak cut and energy management in a factory or a large-scale facility, a large number of energy storage devices are installed and used.

In the future, a storage battery system and an energy storage system (ESS) including a power conditioner and the like in addition to an energy storage device are expected to be installed at many locations.

A technique has been proposed in which a user of an energy storage device or a maintenance operator remotely acquires (remotely monitors) information such as a state of charge (SOC) of the energy storage device in a large-scale ESS via a server device (see Patent Document Japanese Patent No. 6822624).

BRIEF SUMMARY

A large-scale storage battery system or an ESS is constructed by arranging a large number of shelves or boards accommodating energy storage devices in the vicinity.

Identification data for identifying the energy storage device on a remote monitoring system preferably follows a physical arrangement of each energy storage device at the installation place. With such a configuration, the energy storage device can be monitored on a remote monitoring screen which reproduces an actual arrangement of the energy storage device.

It is possible but complicated to assign identification data to the energy storage device in advance and accurately assemble a huge number of energy storage devices based on the installation place at the installation place.

An object of the present invention is to provide a technique for efficiently assigning identification data to an energy storage device in accordance with a physical arrangement of the energy storage device.

A management device includes: a first communication unit that receives state data of an energy storage device; a second communication unit that receives identification data transmitted from a host device; an external terminal to which a switch is connected and which receives an input from the switch; a state detection unit that detects a state of the switch via the external terminal; and a processing unit that stores the identification data in a storage unit when the second communication unit receives the identification data and the state detection unit detects that the switch is in a specific state, in which the state data received by the first communication unit is transmitted to the host device or another device in association with the identification data stored in the storage unit.

BRIEF DESCRIPTION OF THE FIGURES

FIG. 7 is a flowchart illustrating an example of a procedure of an identification data assignment operation.

DETAILED DESCRIPTION OF VARIOUS EMBODIMENTS

Figure 1:
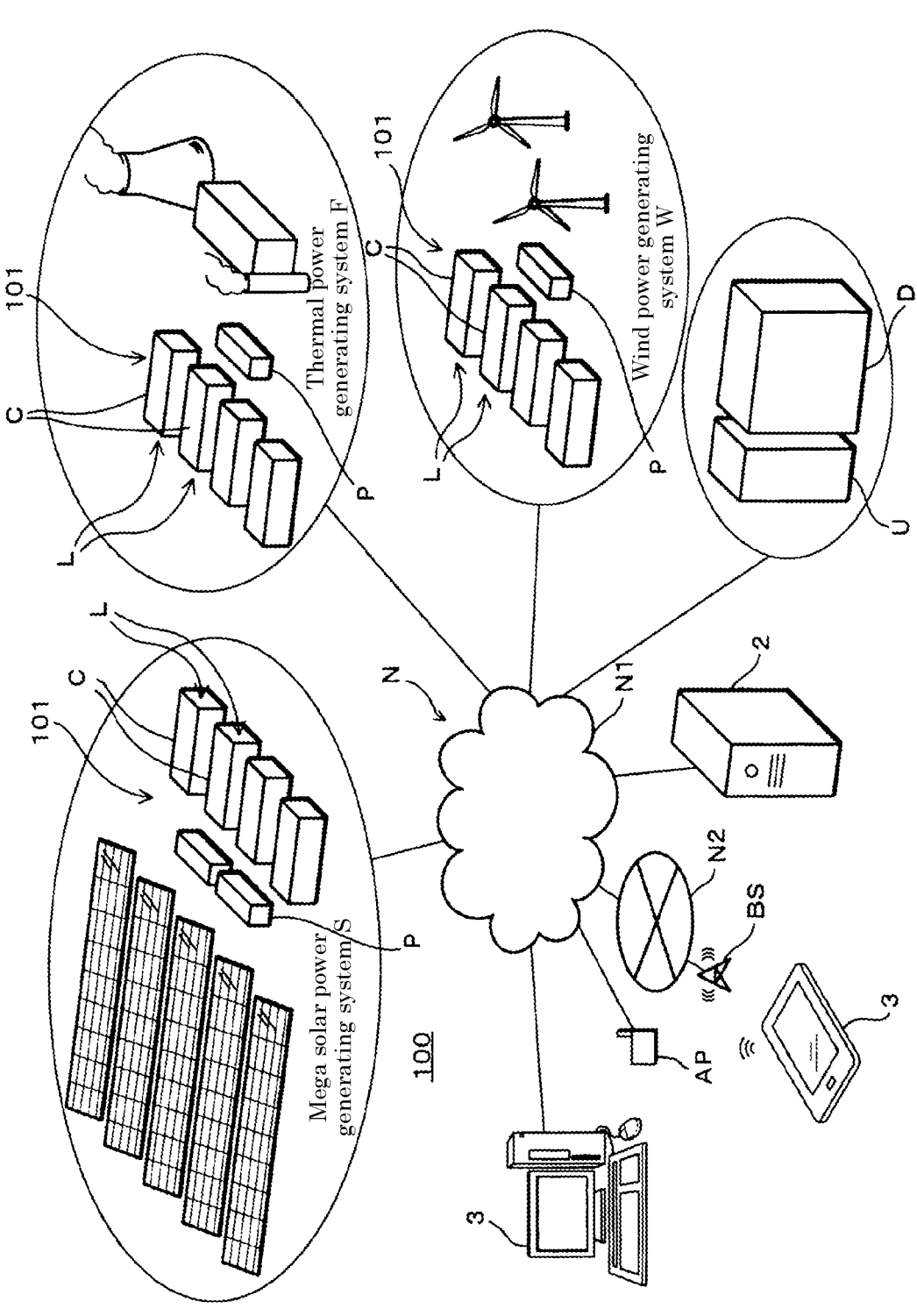
FIG. 1 is a diagram showing an outline of a remote monitoring system.

A management device includes: a first communication unit that receives state data of an energy storage device; a second communication unit that receives identification data transmitted from a host device; an external terminal to which a switch is connected and which receives an input from the switch; and a state detection unit that detects a state of the switch via the external terminal. The management device further includes a processing unit that stores the identification data in a storage unit when the second communication unit receives the identification data and the state detection unit detects that the switch is in a specific state. The management device transmits the state data received by the first communication unit to the host device or another device in association with the identification data stored in the storage unit.

Even if the management device receives the identification data from the host device, the management device does not store the identification data in the storage unit unless the switch is in a specific state. The switch mentioned here is not a switch (that is, a cutoff switch of a charge/discharge path) between the energy storage device and a power supply (for example, a converter), but is connected to an external terminal of the management device, and the management device can identify whether or not the energy storage device is in a specific state. Although it is conceivable to cause the management device to receive an auxiliary signal notifying the state of the cutoff switch of the charge/discharge path, the cutoff switch of the charge/discharge path in the storage battery system or the ESS is relatively large and requires a large force for opening and closing. As the switch connected to the external terminal of the management device, it is preferable to use a switch that can be easily opened and closed with a small force in order to simplify an identification data assignment operation.

With the above configuration, the management device can store the identification data transmitted from the host device in the storage unit when the switch connected to the external terminal is in a specific state. Such switch operation and storage of the identification data can be easily performed after the energy storage device and the management device are installed at the installation places or after the management device is installed. The identification data (for example, the serial number) is transmitted to the host device in ascending or descending order, and the switch operation is performed on the management device of each installed energy storage device group in order following the installation position, whereby each management device stores unique identification data in the storage unit. When there is only one management device to store the identification data, the specific identification data is transmitted to the host device, and the storage unit of the management device stores the identification data.

Accordingly, the identification data can be assigned to the state data of the energy storage device managed by the management device through the management device. It is possible to efficiently assign the identification data to the energy storage device of the large-scale storage battery system or the ESS in accordance with the physical arrangement of the energy storage device.

The switch connected to the external terminal of the management device may be a relatively small pushbutton switch because a high voltage is not applied to the switch unlike the cutoff switch of the charge/discharge path. The specific state may be a pressing state of the pushbutton switch. The pushbutton switch may emit light in a pressed state.

By using such a pushbutton switch, it is possible to reduce the burden of the identification data assignment operation and prevent operation errors.

The processing unit of the management device may transmit a confirmation notification from the second communication unit to the host device when the identification data is stored in the storage unit.

The confirmation notification may include an address, a number, or the like that uniquely identifies the management device. As a result, it is possible to confirm the completion of the assignment of the identification data in the host device and to prevent operation errors in the assignment of the identification data.

Hereinafter, for simplification, the storage battery system is also referred to as an energy storage system. The same applies to the claims.

An energy storage system includes: an energy storage device configured by connecting banks in parallel, each bank including a plurality of energy storage cells connected in series; and a management device that is connected to each bank and receives state data. The energy storage system further includes a host device connected to the management device of each bank via a communication bus. The host device sequentially sends identification data to the communication bus. The management device includes a state detection unit that detects a state of a switch connected via an external terminal. The management device stores the identification data in a storage unit when the management device receives the identification data sent from the host device to the communication bus and the state detection unit detects that the switch is in a specific state.

An energy storage system including a plurality of banks generally includes the same number of modules and the same number of energy storage cells in each bank. In each bank, the management device can communicate with, for example, a control board included in each module to identify the state data of each energy storage cell. On the other hand, in order for the host device or another device to identify the state data of each energy storage cell, information indicating the state data of the energy storage cell included in which bank is required.

As in the above configuration, the identification data is sequentially transmitted to the host device, and the switch of the management device of each bank connected to the communication bus is sequentially operated to store the identification data in the management device. As a result, the host device or another device can identify the state data of each energy storage cell.

In a large-scale energy storage system, the number of banks is large, and the number of management devices provided in the banks is also large. It is possible to efficiently store the identification data in such a large number of management devices.

Each of the management devices may transmit the state data to the host device or another device in association with the identification data stored in the storage unit.

With such a configuration, the energy storage device can be monitored on a remote monitoring screen which reproduces an actual arrangement of the energy storage device.

The management device may transmit a confirmation notification to the host device when storing the identification data in the storage unit, and the host device may transmit next identification data after receiving the confirmation notification from the management device. After receiving the confirmation notification from the management device, the host device may transmit next identification data, for example, when receiving an instruction to start transmission.

With the above configuration, the identification data for identifying the bank can be sequentially and reliably assigned to the management device of each bank.

The host device may include a communication unit that communicates with and connects to a terminal device of an operator having a display and an input interface, and receive an instruction to start sending the identification data by the communication unit.

As a result, it is possible to improve the efficiency of the identification data assignment operation. For example, one of the two workers operates the terminal device to instruct the host device to start sending the identification data, and the other one sequentially operates the switch of the management device, so that the identification data assignment operation can be made efficient.

The host device may receive input or selection of identification data of a domain configured by connecting a plurality of banks in parallel, and store identification data of the domain. In this case, the host device transmits the state data of the energy storage device to another device in association with the identification data of the domain and the identification data of the bank.

When the host device stores the identification data of the domain, another device can acquire the state data associated with both the identification data of the domain and the identification data of the bank.

In a method (manufacturing method) for constructing an energy storage system, first, a management device that receives state data is connected to each bank of energy storage devices configured by connecting a plurality of banks each including a plurality of energy storage cells connected in series in parallel. Second, a host device is connected to the management device of each bank via a communication bus. Third, the host device is caused to start processing of sequentially sending identification data to the communication bus. Fourth, the switch connected to the external terminal of the management device of each bank is caused to transition to a specific state in the order of the bank installation position. Fifth, the identification data is stored in the management device in the order of the installation position.

As the switch connected to the external terminal of the management device, a switch that is relatively small and does not require a large force to turn on and off can be used because a high voltage is not applied unlike the cutoff switch of the charge/discharge path. In a large-scale energy storage system, the number of banks is large, and the number of management devices provided in the banks is also large. It is possible to efficiently store the identification data in such a large number of management devices.

The present invention will be specifically described with reference to the drawings showing an embodiment thereof.

FIG. 1 is a diagram showing an outline of a remote monitoring system 100. The remote monitoring system 100 enables remote access to information on energy storage devices and power supply related devices included in each of a mega solar power generating system S, a thermal power generating system F, and a wind power generating system W. In addition, an uninterruptible power system (UPS) U, a railway rectifier, may be remotely monitored.

A power conditioning system (PCS) P and an energy storage system 101 are provided in parallel in each of the mega solar power generating system S, the thermal power generating system F, and the wind power generating system W. The energy storage system 101 hierarchically includes a large number of energy storage devices. The energy storage devices are preferably secondary batteries such as lead-acid batteries or lithium ion batteries or capacitors, which are rechargeable. Some of the energy storage devices may be a non-rechargeable primary battery.

In the remote monitoring system 100, a communication device 4 (see FIG. 4) is mounted on/connected to each of a management device 1D (see FIG. 4) included in the energy storage system 101 in the systems S, F, and W to be monitored or the power supply related device (P, U, D). The remote monitoring system 100 includes the communication device 4, a server device 2 that collects information from the communication device 4, a client device 3 that browses the collected information, and a network N that is a communication medium between the devices.

The server device 2 includes a web server function, and sequentially stores information (state data) obtained from the communication device 4 mounted on/connected to each monitoring target device via the network N. In response to an access and a request from the client device 3, the server device 2 presents the stored state of the monitoring target device on a web page.

The network N includes a public communication network N1 that is a so-called Internet and a carrier network N2 that realizes wireless communication according to a predetermined mobile communication standard. The public communication network N1 includes a general optical line. The network N may include a dedicated line to which the server device 2 is connected. The carrier network N2 includes a base station BS, and the client device 3 can communicate with the server device 2 from a base station BS via the network N. An access point AP is connected to the public communication network N1, and the client device 3 can transmit and receive data from the access point AP to and from the server device 2 via the network N.

Figure 2:
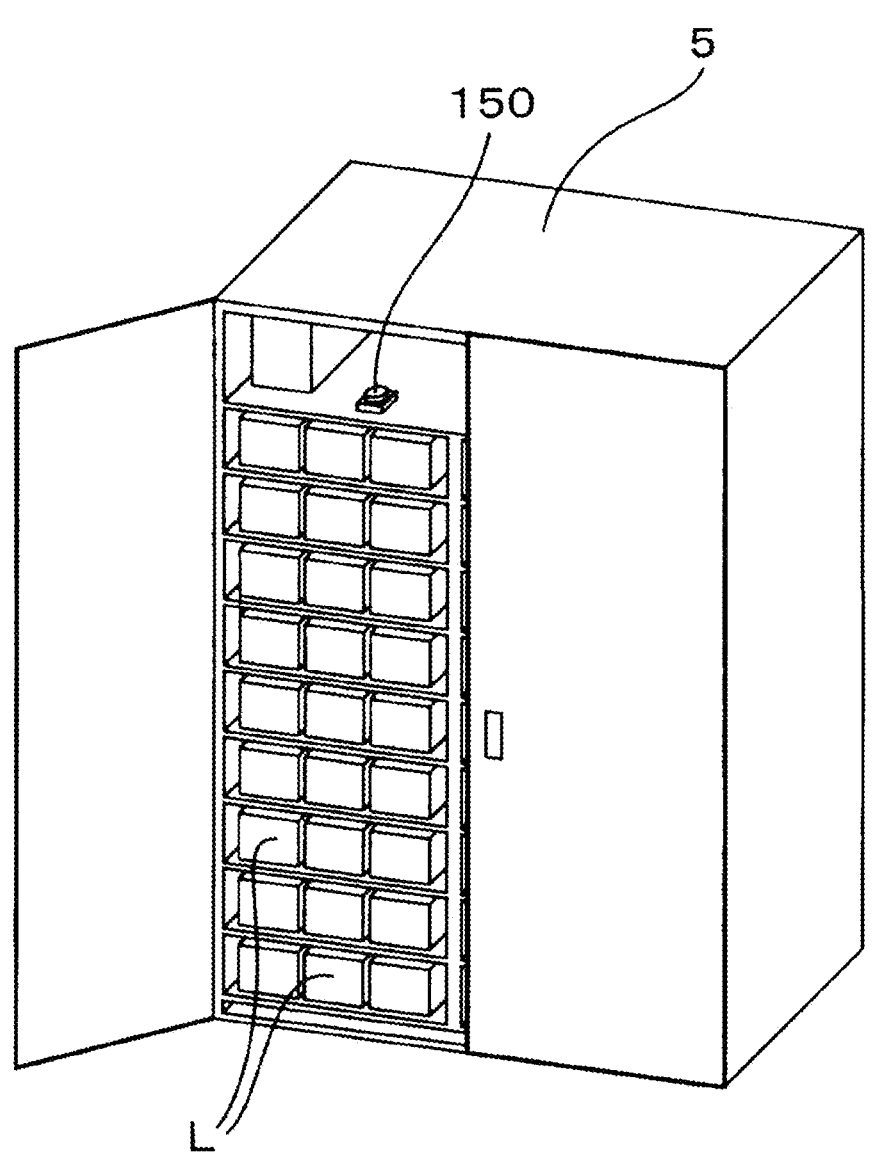
FIG. 2 is a diagram illustrating an example of a battery board.

The energy storage system 101 is configured such that a large number of energy storage devices are accommodated in shelves or battery boards arranged in a building or a container. FIG. 2 illustrates an example of a battery board 5. As shown in FIG. 2, the battery board 5 houses a plurality of (for example, 54) energy storage modules L. The plurality of energy storage modules L are divided into a plurality of groups by wiring (not illustrated), and connected in series in each group. A group in which the plurality of energy storage modules L are connected in series is referred to as a bank. The battery board 5 accommodates, for example, three banks, and each bank is configured by connecting 18 energy storage modules L in series.

In the battery board 5, one switch 150 is provided for each bank. The switch 150 will be described later.

Each of the energy storage modules L includes a plurality of energy storage cells (also referred to as cells), and is configured by, for example, connecting a plurality of cells in series. The energy storage module L includes a control board (cell management unit (CMU)) that performs state detection and management processing of energy storage cells (see FIG. 4).

Figure 3:
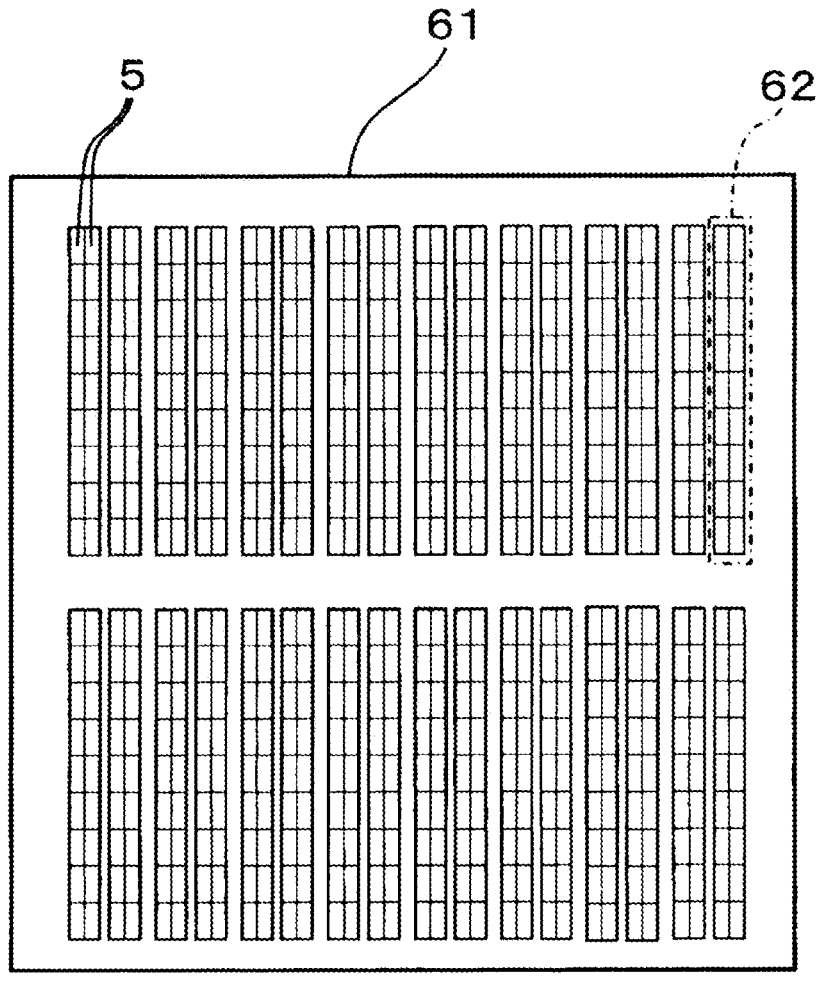
FIG. 3 is a diagram illustrating an example of arrangement of battery boards.

FIG. 3 illustrates an example of the arrangement of the battery boards 5. In FIG. 3, a plurality of (for example, 18) battery boards 5 constitute one unit 62. On the back surface of a plurality of (for example, nine) battery boards 5 arranged side by side, a plurality of (for example, nine) battery boards 5 arranged side by side similarly are arranged back-to-back.

The remote monitoring system 100 is required to indicate a state such as an SOC for each energy storage module L and for each energy storage cell included in the energy storage module L. Therefore, it is necessary to individually identify each energy storage module L and an energy storage cell included in the energy storage module L. The communication device 4 shown in FIG. 4 acquires state data for each of the energy storage module L and the energy storage cell in association with identification data of the energy storage module L and the energy storage cell, and transmits the state data to the server device 2.

For the energy storage cells, the series order of the energy storage cells can be determined by the control board included in the energy storage module L. In the present disclosure, the management device 1B is provided for each bank, and each identification data is recognized. The communication device 4 transmits the data indicating the states of the energy storage module L and the energy storage cell obtained from the management device 1B to the server device 2 in association with the identification data. Hereinafter, a case where the identification data is assigned to each bank will be described, but alternatively, the identification data may be assigned in units of groups different from the banks.

Figure 4:
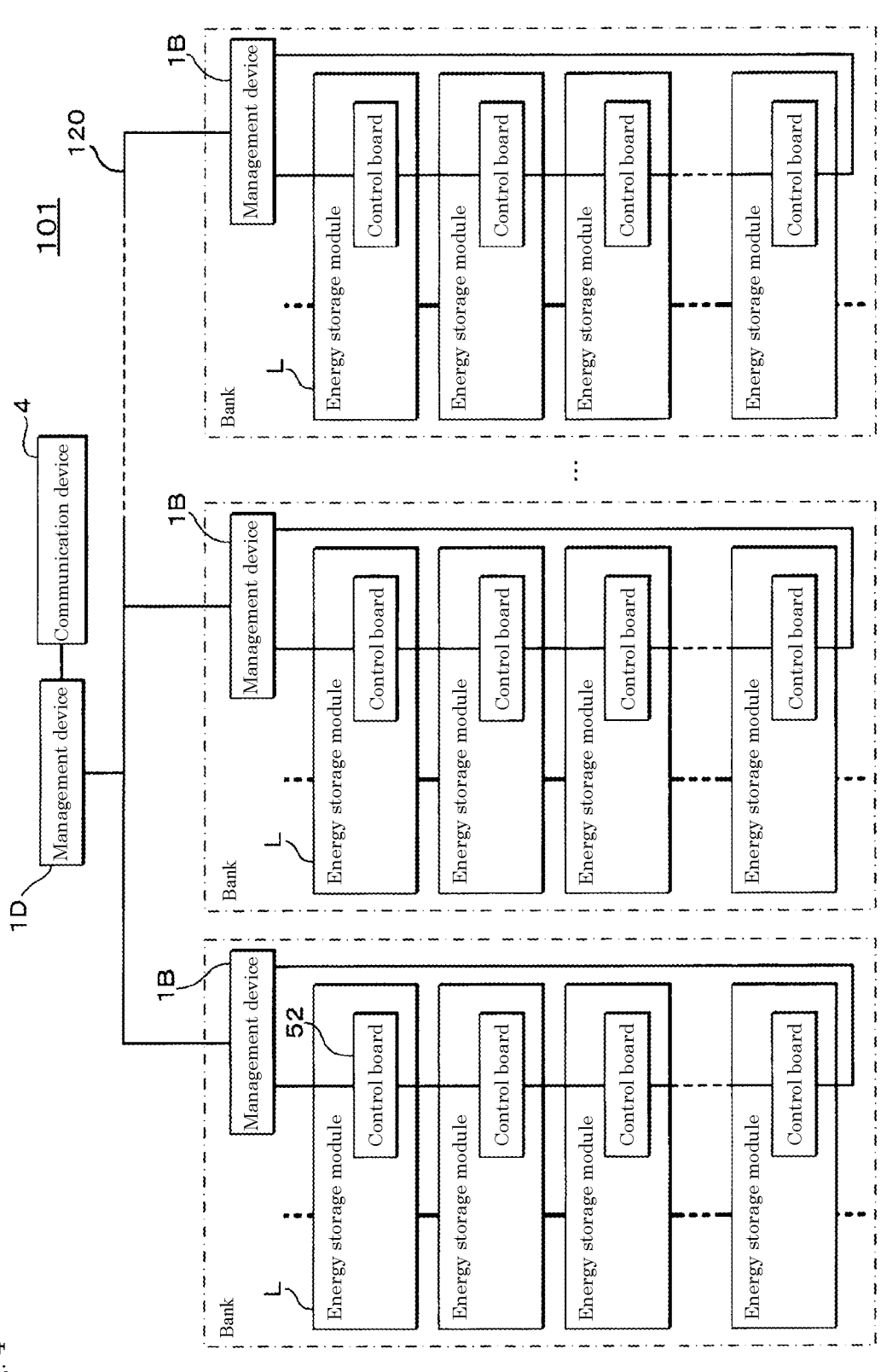
FIG. 4 is a diagram showing an example of a hierarchical structure of energy storage devices in an energy storage system, and a connection form of a management device and a communication device.

In the energy storage system 101 shown in FIG. 4, the energy storage modules L are connected in series to form a bank. As described above, three banks may be accommodated in one battery board 5. The energy storage system 101 has a hierarchical structure of a bank in which a plurality of energy storage modules L are connected in series and a domain in which a plurality of banks are connected in parallel.

In the example of FIG. 4, one management device 1 is provided for each bank and domain. When the management device 1 provided in the bank is distinguished from the management device 1 provided in the domain, the former is referred to as the management device 1B, and the latter is referred to as the management device 1D. The management device 1B provided in each bank communicates with a control board with a communication function built in the energy storage module L in the bank by serial communication. The management device 1B acquires state data (measurement data. cell voltage, module voltage, etc.) of the energy storage module L. The management device 1B also acquires temperature data measured by the energy storage module L and current data measured for each bank. The management device 1B may execute management processing such as detection of abnormality of the communication state.

The management device 1D provided in the domain can communicate with the management device 1B of the bank via a communication bus 120. The communication bus 120 is, for example, a CAN bus. The communication bus 120 may alternatively be a LAN cable or a communication medium compatible with ECHONET/ECHONET Lite (registered trademark).

The management device 1D of the domain may aggregate the state data acquired by the management device 1B of the bank. The communication device 4 is connected to the management device 1D of the domain. The communication device 4 transmits the state data acquired from each management device 1B via the management device 1D.

The communication device 4 may be a terminal device (measurement monitor) that communicates with the management device 1 to receive information on the energy storage device, or may be a controller compatible with ECHONET/ECHONET Lite. The communication device 4 may be an independent device, for example, a router-type communication device. The communication device 4 may be a network card type device (network interface card).

In the energy storage system 101 configured as described above, a configuration included in each management device 1 and processing executed in the management device 1 in order to assign identification data will be described.

Figure 5:
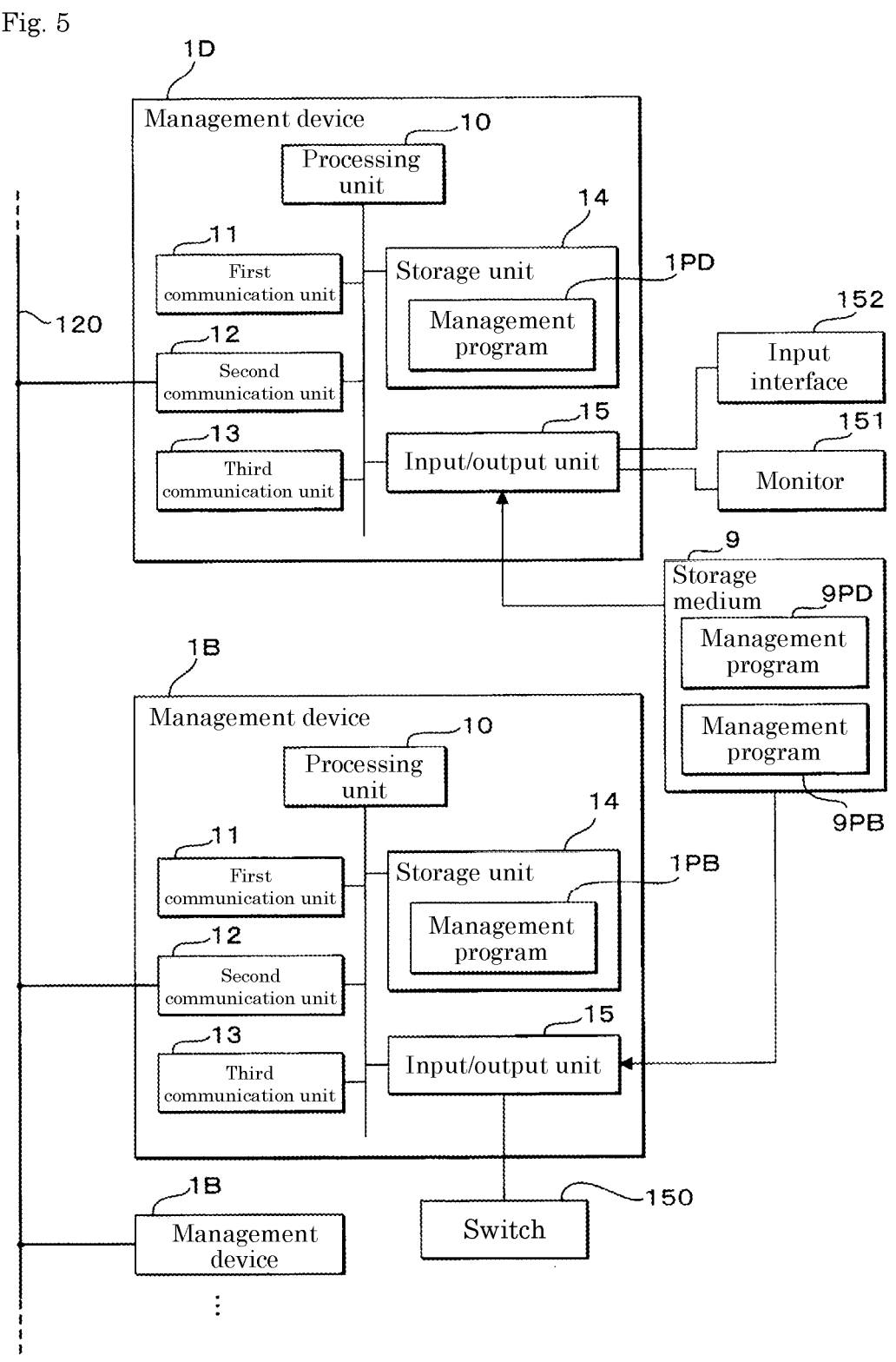
FIG. 5 is a block diagram illustrating an example of a configuration of the management device.

FIG. 5 is a block diagram illustrating a configuration of the management device 1. Although the management device 1D and the management device 1B are illustrated separately, the configurations are substantially the same.

The management device 1 includes a processing unit 10, a first communication unit 11, a second communication unit 12, a third communication unit 13, a storage unit 14, and an input/output unit 15.

The processing unit 10 is a microcomputer, and executes processing by controlling each component using a central processing unit (CPU) and a memory such as a built-in read only memory (ROM) and a random access memory (RAM).

The first communication unit 11 is a communication device that realizes communication with the control board. Specifically, the first communication unit 11 is a serial communication interface such as an RS-232C.

The second communication unit 12 is a communication device that realizes communication with another management device 1. The second communication unit 12 is, for example, a communication device that realizes communication on the CAN bus.

The third communication unit 13 is a communication device that realizes communication with the communication device 4. The third communication unit 13 uses, for example, a communication interface such as Ethernet (registered trademark) or a wireless communication antenna.

A part of the first communication unit 11 to the third communication unit 13 may be incorporated in the processing unit 10 that is a microcomputer.

The storage unit 14 uses a non-volatile memory such as a flash memory. The storage unit 14 stores a management program 1P read and executed by the processing unit 10. A management program 1PD stored in the storage unit 14 of the management device 1D of the domain and a management program 1PB stored in the storage unit 14 of the management device 1B of the bank have different contents. The management program 1PB and the management program 1PD may be stored in the ROM built in the processing unit 10.

The management program 1PB and the management program 1PD may be rewritable. In the management program 1PB or the management program 1PD, the processing unit 10 may read the management program 9PB or the management program 9PD stored in the storage medium 9 via the input/output unit 15, copy the management program 9PB or the management program 9PD, and store the copied management program 9PB or 9PD in the storage unit 14.

The storage unit 14 stores communication settings in the first communication unit 11, the second communication unit 12, and the third communication unit 13. The processing unit 10 can communicate with the control board, the other management device 1, and the communication device 4 based on the communication settings stored in the storage unit 14.

The storage unit 14 stores identification data of a hierarchy to which the management device 1 (own device) belongs. The storage unit 14 of the management device 1D of the domain stores domain identification data for identifying a domain. The storage unit 14 of the management device 1B of the bank stores bank identification data for identifying a bank. A method for storing the domain identification data and the bank identification data will be described later.

The storage unit 14 temporarily stores the state data acquired from the control board until the state data is transferred to the communication device 4.

The input/output unit 15 is a connection interface with an external device. The input/output unit 15 includes a plurality of external terminals. The external terminal includes a connector for liquid crystal panel connection. The external terminal includes an input terminal that receives an input from a switch to be described later. The external terminal may include a universal serial bus (USB).

The switch 150 is connected to the input/output unit 15 of the management device 1B of the bank. The switch 150 is provided on the battery board 5 so as to be operable by an installation operator (see FIG. 2). As the switch 150, other switches such as a dip switch, a rocker switch, a tactile switch, and a toggle switch may be used instead of a pushbutton switch as illustrated in FIG. 2. In the present specification, a short-circuit connector (for example, a connector that temporarily short-circuits an unused pin (empty pin) in the connector) is also included in the meaning of a switch. By using a short-circuit connector that can be inserted into and removed from an empty pin in the connector, an increase in the number of components can be prevented and a production cost can be reduced. The processing unit 10 can detect that the switch 150 is operated or being operated via the input/output unit 15. If the switch 150 is a pushbutton switch with a lamp, the processing unit 10 may turn on the lamp to notify the operator that the switch is in the pressed state in a manner that the operator can visually recognize the switch. In a case where the switch 150 is a dip switch, a rocker switch, or a toggle switch, the operator can visually recognize the switch state depending on the posture of the switch. In a case where the switch 150 is a tactile switch, the switch 150 may be provided with a lamp, a display, or a speaker so that an operator can confirm whether or not the switch 150 is pressed.

A monitor 151 and an input interface 152 can be connected to the input/output unit 15 of the management device 1D of the domain. The monitor 151 and the input interface 152 may be integrated by a liquid crystal panel with a built-in touch panel. The monitor 151 and the input interface 152 may be replaced with a terminal device of an operator having a display and an input interface which are connected to communicate in a wired or wireless manner. The wired or wireless communication connection may be performed via the communication device 4. The processing unit 10 can receive an operation to be described later by the installation operator via the input/output unit 15.

Figure 6:
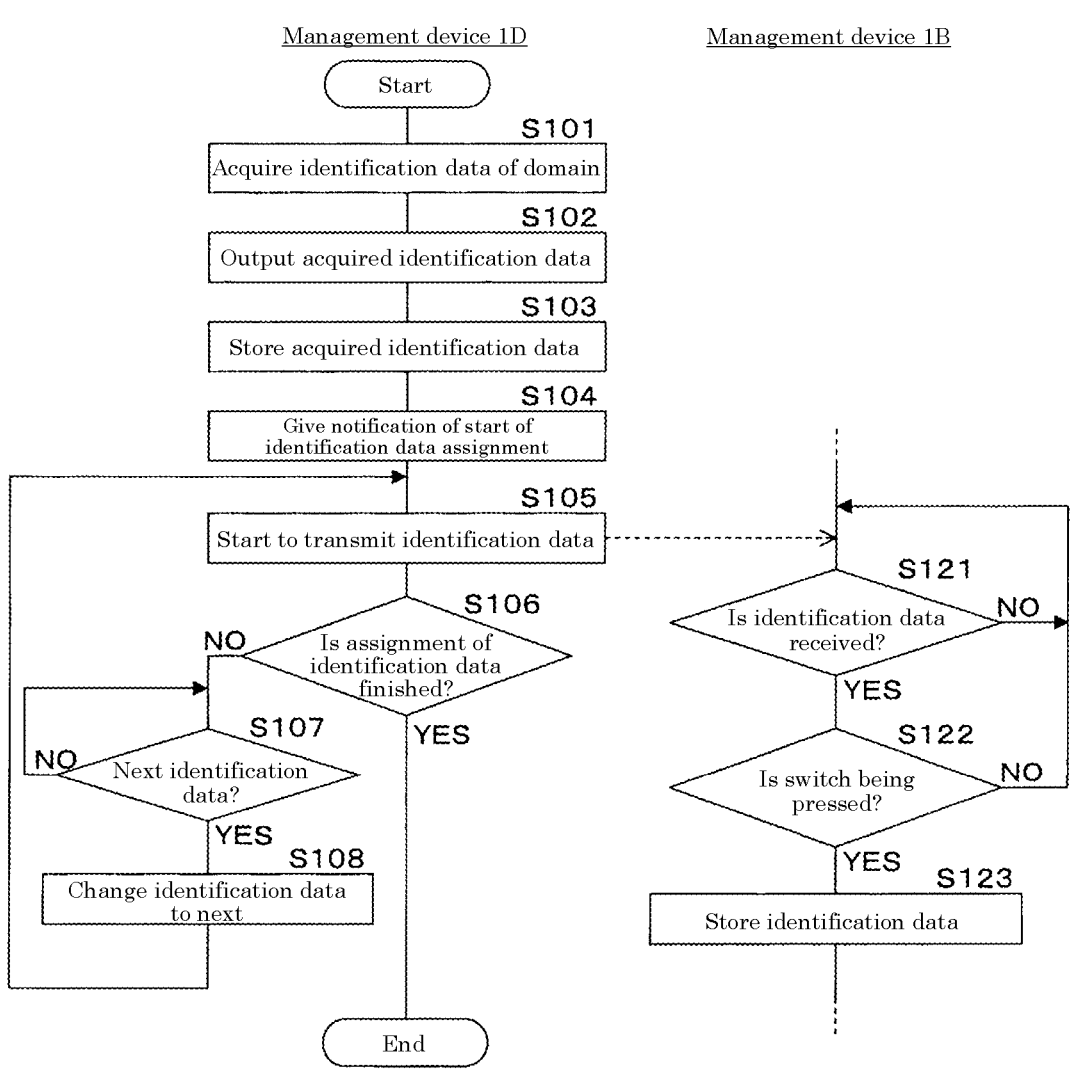
FIG. 6 is a flowchart illustrating an example of a processing procedure by the management device.

The management device 1B and the management device 1D cooperate to store the identification data by the following processing based on each of the management program 1PB and the management program 1PD. FIG. 6 is a flowchart illustrating an example of a processing procedure by the management device 1.

When the processing unit 10 of the management device 1D detects that the instruction to assign the identification data is received via the input/output unit 15, the following processing is started. The instruction to assign the identification data is to input a specific interrupt signal via the input/output unit 15, to receive a specific command input, to receive an instruction via the communication device 4, or the like.

The processing unit 10 of the management device 1D acquires the identification data of the domain (step S101). In step S101, the processing unit 10 acquires the identification data input by operating the monitor 151 and the input interface 152 via the input/output unit 15. The processing unit 10 may receive the identification data of the domain from the terminal device of the operator or the communication device 4 by communication.

The processing unit 10 outputs the acquired identification data (unit number) of the domain to the monitor 151 (step S102), and stores the identification data (unit number) in the storage unit 14 when receiving the confirmation operation (step S103).

The domain identification data may not be acquired, that is, steps S101 to S103 may be omitted.

When giving a notification of the start message of the assignment of the identification data of each bank by outputting the message to the monitor 151 (step S104), the processing unit 10 starts to transmit the identification data one by one in a predetermined order from the second communication unit 12 to the communication bus 120 (step S105). In step S104, the processing unit 10 may notify the management device 1B of each bank of the start of the assignment of the identification data to the communication bus 120. In step S105, the processing unit 10 may output the transmitted identification data to the monitor 151.

The processing unit 10 determines whether or not to finish assignment of the identification data (step S106). In step S106, the processing unit 10 may make a determination on the basis of whether or not a predetermined number of pieces of identification data has been assigned, or may make a determination on the basis of whether or not an end instruction has been received via the input interface 152. Alternatively, the processing unit 10 may cause the monitor 151 to display a message asking whether or not the next bank is present, determine not to end the assignment of the identification data when the next bank is selected or input, and determine to end the assignment of the identification data when the next bank is not present. Alternatively, the processing unit 10 may make the determination on the basis of whether or not reception confirmation notifications have been received from the management devices 1B of all the banks connected to the communication bus 120.

When it is not determined in step S106 that the assignment of the identification data is to be ended (S106: NO), the processing unit 10 determines whether or not to change to the next identification data (step S107). In step S107, the processing unit 10 may make a determination on the basis of whether or not a predetermined standby time has elapsed or whether or not an instruction to change to the next identification data has been received via the input interface 152. Alternatively, the processing unit 10 may make a determination on the basis of whether or not a reception confirmation notification has been received from the management device 1B of the target bank via the communication bus 120.

When it is determined in step S107 that the identification data is not changed to the next identification data (S107: NO), the processing unit 10 returns the processing to step S107 and stands by.

When it is determined in step S107 that the identification data is changed (S107: YES), the processing unit 10 changes the identification data (step S108) and returns the processing to step S105. In a case where the reception confirmation notification can be received from the management device 1B of the target bank, the processing unit 10 may output the reception confirmation notification to the monitor 151 when receiving the reception confirmation notification. In this case, the processing unit 10 may store the identification data transmitted to the management device 1B of the bank and data for identifying the hardware of the management device 1B, for example, a CANID, a MAC address, and the like in the communication bus 120 in association with each other.

When it is determined in step S106 that the assignment of the identification data is to be ended (S106: YES), the processing unit 10 ends the processing. At the end, the processing unit 10 may give a notification of the end of the assignment, or may output an end message to the monitor 151.

When the management device 1B of each bank is activated by receiving power supply from a power source or an energy storage device, the following processing is initially started. The processing unit 10 of the management device 1B determines whether or not the identification data is received via the communication bus 120 (step S121).

When it is determined that the identification data has not been received (S121: NO), the processing unit 10 returns the processing to step S121 and waits until it is determined that the identification data has been received.

When it is determined that the identification data has been received (S121: YES), the processing unit 10 determines whether or not the switch 150 connected via the input/output unit 15 is pressed (step 122). In step S122, the processing unit 10 determines whether or not the switch 150 remains pressed after the transmission of the identification data is started. Alternatively, the processing unit 10 may determine whether or not the switch 150 has been pressed even once after the transmission of the identification data is started. Alternatively, the processing unit 10 may wait for a predetermined time after determining that the identification data has been received (S121: YES), and determine whether or not the switch 150 has been pressed during that time.

When it is determined that the switch 150 is pressed (S122: YES), the processing unit 10 stores the identification data received in step S121 in the storage unit 14 as identification data of a group (bank) to which the own device belongs (step S123). In step S123, the processing unit 10 may notify the management device 1D of the domain of the reception confirmation from the second communication unit 12 via the communication bus 120. After storing the identification data of the own device, the processing unit 10 ends the processing of assigning the identification data.

When it is determined that the switch 150 is not pressed (S122: NO), the processing unit 10 ignores the identification data even if the identification data is received, and returns the processing to step S121.

When activated, the processing unit 10 of the management device 1B executes processing as illustrated in FIG. 6, and after storing the identification data of the own device, executes management processing such as acquisition of data from the control board and transmission of the acquired data to the communication device 4.

Using the management device 1B and the management device 1D that execute such processing, the installation operator assigns identification data by the following procedure. As a result, the energy storage system 101 including the management device 1 storing identification data in ascending or descending order following the installation position is constructed.

FIG. 7 is a flowchart illustrating an example of a procedure of the identification data assignment operation. When the installation operator installs the battery board 5, performs wiring in the battery board 5, and completes assembling as the unit 62 (see FIG. 3), the installation operator activates the management devices 1 for all the battery boards 5 constituting the unit 62 and executes the following processing.

Procedure 1: The installation operator connects the monitor 151 and the input interface 152 or a device substitutable therefor to the input/output unit 15 of the management device 1D of the domain (unit).

Procedure 2: The installation operator selects an identification data assignment menu displayed in the operation screen displayed on the monitor 151 by the input interface 152, and starts identification data assignment processing.

Procedure 3: An input screen for domain identification data is displayed on the monitor 151. The installation operator inputs the identification data of the domain through the input interface 152. The identification data of the domain may be, for example, a serial number in the energy storage chamber 61 (see FIG. 3), or may be a combination with the identification data of the energy storage chamber 61. When the confirmation screen of the identification data of the domain is displayed on the monitor 151, the installation operator may confirm the confirmation screen.

Procedure 4: The installation operator confirms that a start message of the assignment of the identification data has been output to the monitor 151 connected to the management device 1D, and operates the switch 150 of the first bank in the domain.

Procedure 5: When the installation operator confirms that the predetermined time has elapsed or confirms that the completion of the assignment of the identification data of one bank (reception confirmation notification) is output to the monitor 151, the installation operator releases the operation state of the switch 150.

Procedure 6: The installation operator operates the switch 150 of the next bank. In Procedure 6, a message asking whether or not the next bank is present and a selection screen of YES/NO are displayed on the monitor 151, and when the installation operator selects YES using the input interface 152, the operation of the switch 150 of the next bank may be awaited by the management device 1.

Procedure 7: When the installation operator confirms that the predetermined time has elapsed or confirms that completion of assignment of the identification data of one bank (reception confirmation notification) is output to the monitor 151, the installation operator releases the operation state of the switch 150. The installation operator repeats Procedure 6 and Procedure 7 for all the banks in the domain.

Procedure 8: When the installation operator completes the operation of the switches 150 of all the banks, the installation operator executes an operation for ending the assignment of the identification data on the operation screen displayed on the monitor 151.

Procedure 9: The installation operator removes the monitor 151 and the input interface 152, or a device alternative thereto, from the input/output unit 15 of the management device 1D.

Figure 8:
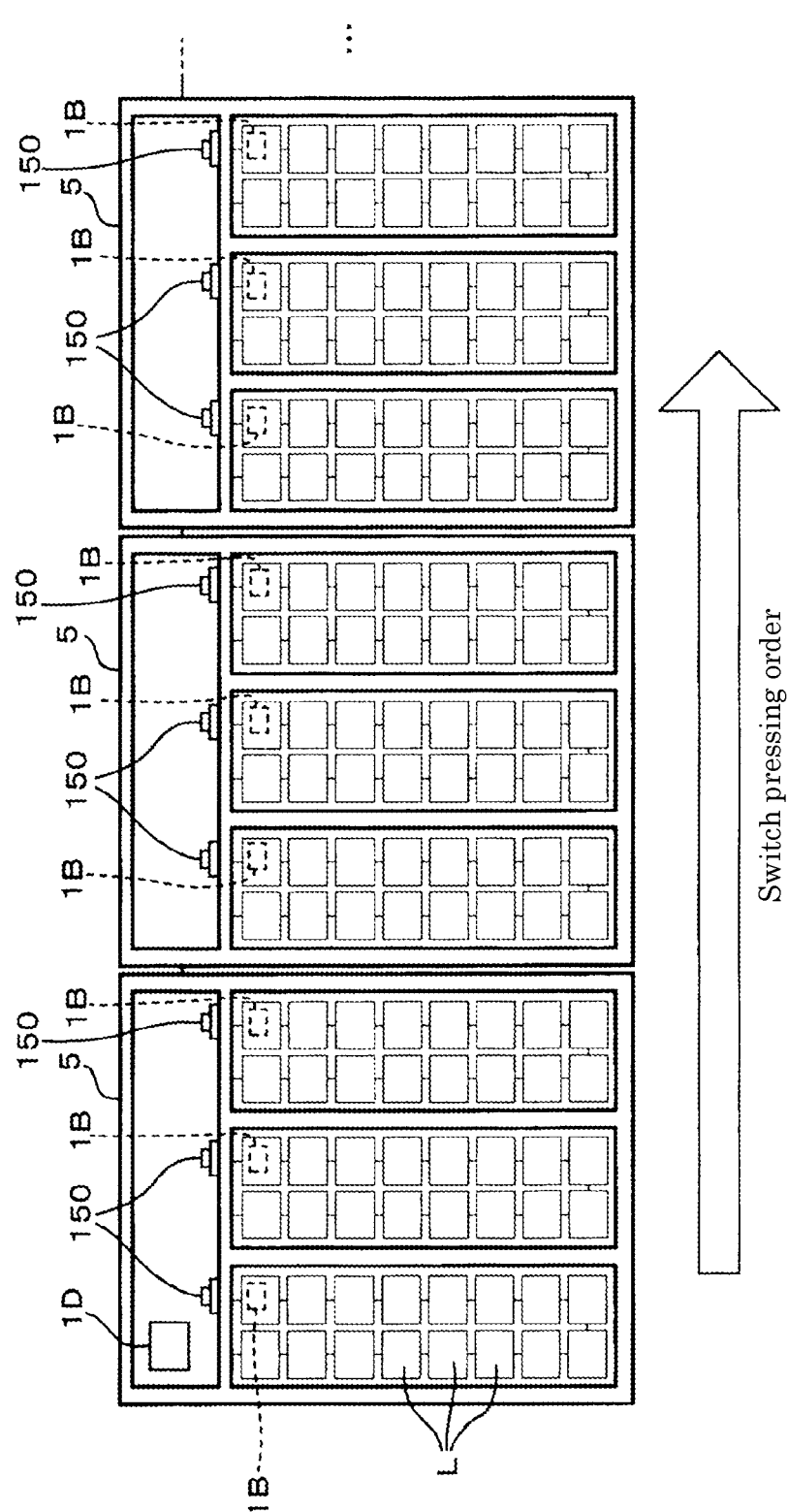
FIG. 8 is a diagram illustrating an example of the identification data assignment procedure.
Figure 9:
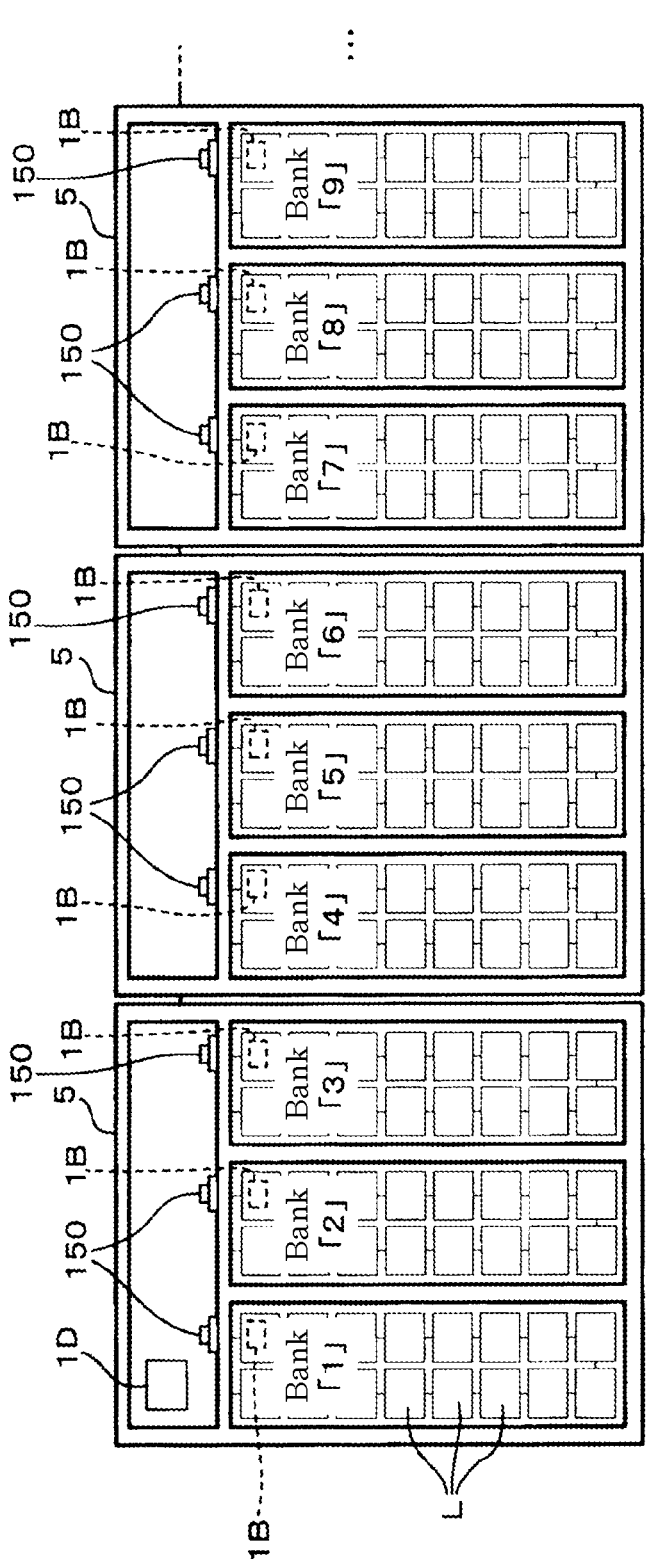
FIG. 9 is a diagram illustrating an example of identification data assigned by the identification data assignment procedure.

A program for assigning identification data may be configured such that some procedures of FIG. 7, for example, Procedure 4 to Procedure 8 are continuously executed. That is, after "continuous assignment" is instructed through the input interface 152, the identification data may be automatically sequentially sent from the host device without an additional instruction from the input interface 152, and the installation operator may sequentially operate the switches of the respective banks. The program may execute individual input processing for correcting identification data that has not been properly input. The installation operator executes the procedure illustrated in FIG. 7 for all the units. FIGS. 8 and 9 illustrate examples of identification data assigned by an identification data assignment procedure. FIG. 8 illustrates a state in which the battery boards 5 are arranged in parallel before the identification data is provided. By operating the plurality of switches 150 in order from the left side in FIG. 8, identification data (identification numbers) of "1" to "9" is assigned in order from the left side as illustrated in FIG. 9.

The energy storage system 101 can transmit the state data of each energy storage device to the server device 2 by the communication device 4 in association with the identification data.

The server device 2 shown in FIG. 1 stores a correspondence relationship between the assigned identification data and the layout of the energy storage system 101. For example, the server device 2 may store the correspondence relationship between the identification data and the layout as layout data (design drawing).

The correspondence relationship between the identification data and the layout may be recognized not only by the layout data but also by the data structure itself. The data structure has, for example, a structure adapted to the hierarchical structure of domain/bank/energy storage module L/energy storage cell. The data of each of the plurality of energy storage cells is stored in a folder of one energy storage module L to which the data belongs, the folders of the plurality of energy storage modules L are stored in a folder of one bank to which the data belongs, and the folders of the plurality of banks are stored in a folder of one domain. The data structure may be created by the server device 2. The communication device 4 may transmit the state data of the energy storage device in the energy storage system 101 in a data structure corresponding to the hierarchical structure.

In the remote monitoring system 100, the server device 2 can store the state data of each energy storage device in association with the identification data in a data structure corresponding to the connection form of the energy storage system 101.

The server device 2 can provide a screen on which the arrangement of the actual energy storage devices (battery boards) is matched with the order of the identification data allocated to the energy storage devices and the state data can be easily intuitively grasped.

The embodiment disclosed as described above is illustrative in all respects and is not restrictive. The scope of the present invention is defined by the claims, and includes meanings equivalent to the claims and all modifications within the scope.

The invention claimed is:

1. An energy storage system comprising:
   an energy storage device configured by connecting a plurality of banks in parallel, each bank including a plurality of energy storage cells connected in series;
   a plurality of management devices that are provided for the plurality of banks and receive state data, respectively; and
   a host device connected to the plurality of management devices via a communication bus,
   wherein the host device sequentially sends identification data to the communication bus and outputs to a display the identification data being sent or a message to an operator, and
   each of the management devices include a state detection unit that detects a state of a switch connected via an external terminal of each of the management devices, and
   stores the identification data in a storage unit of each of the management devices when the management device receives identification data sent from the host device to the communication bus and the state detection unit detects that the switch is in a specific state.

2. The energy storage system according to claim 1, wherein
   the management device transmits a confirmation notification to the host device when storing the identification data in the storage unit, and
   the host device transmits next identification data after receiving the confirmation notification from the management device.

3. The energy storage system according to claim 1, wherein the host device includes a communication unit that communicates with and connects to a terminal device of an operator comprising the display and an input interface, and receives an instruction to start sending the identification data by the communication unit.

4. The energy storage system according to claim 1, wherein the host device receives input or selection of identification data of a domain configured by connecting the plurality of banks in parallel, and stores identification data of the domain.

5. The energy storage system according to claim 1, wherein a plurality of the switches are provided for the plurality of management devices, respectively, and
   each of the switches is physically operable by an operator assigning the identification data to the plurality of management devices.

6. The energy storage system according to claim 1, wherein the host device outputs to the display a message notifying a start of assigning the identification data to the plurality of management devices.

7. The energy storage system according to claim 1, further comprising a communication device that is connected to the host device,
   wherein the host device wirelessly outputs, via the communication device, to a terminal device of an operator comprising the display the identification data being sent or the message to the operator.

8. A method for constructing an energy storage system, comprising:
   connecting a plurality of management devices that receive state data to a plurality of banks of an energy storage device;
   connecting a host device to the plurality of management devices via a communication bus;
   causing the host device to start processing of sequentially sending identification data to the communication bus and to output to a display the identification data being sent or a message to an operator;
   causing a switch connected to an external terminal of each of the management devices to transition to a specific state in order of an installation position of the bank; and
   causing the management device to store identification data in order of the installation position.

9. The method according to claim 8, wherein the host device is caused to output to the display a message notifying a start of assigning the identification data to the plurality of management devices.

10. An energy storage system comprising:
    an energy storage device configured by connecting a plurality of banks in parallel, each bank including a plurality of energy storage cells connected in series;
    a plurality of management devices that are provided for the plurality of banks and receive state data, respectively; and
    a host device connected to the plurality of management devices-via a communication bus,
    wherein the host device sequentially sends identification data to the communication bus and outputs to a display the identification data being sent or a message to an operator, and
    each of the management devices include a state detection unit that detects a state of a switch connected via an external terminal of each of the management devices,
    stores the identification data in a storage unit of each of the management devices when the management device receives identification data sent from the host device to the communication bus and the state detection unit detects that the switch is in a specific state,
    transmits a confirmation notification to the host device when storing the identification data in the storage unit, and
    the host device sends next identification data to the communication bus after receiving the confirmation notification from the management device and outputs to the display the next identification data being sent.

* * * * *